(12) United States Patent
Prineppi

(10) Patent No.: US 6,603,302 B2
(45) Date of Patent: Aug. 5, 2003

(54) CIRCUIT TESTERS

(76) Inventor: Frank Joseph Prineppi, PMB 341, 1323 SE. 17th St., Ft. Lauderdale, FL (US) 33316

( * ) Notice: Subject to any disclaimer, the term of this patent is extended or adjusted under 35 U.S.C. 154(b) by 0 days.

(21) Appl. No.: 10/277,898

(22) Filed: Oct. 23, 2002

(65) Prior Publication Data

US 2003/0052666 A1 Mar. 20, 2003

Related U.S. Application Data

(63) Continuation-in-part of application No. 09/921,411, filed on Aug. 1, 2001, now abandoned.

(51) Int. Cl.[7] .................... G01R 1/02; G01R 31/302; G01R 31/28; G01R 1/07; G01B 21/00
(52) U.S. Cl. .................. 324/133; 324/414; 324/750; 324/530; 324/556; 324/149; 340/642; 340/652
(58) Field of Search .................. 324/133, 522, 324/529, 530, 414, 750, 556, 72.5, 126, 149; 340/652, 641, 642, 661

(56) References Cited

U.S. PATENT DOCUMENTS 3,964,039 A * 6/1976 Craford et al. ............ 340/660
5,047,721 A * 9/1991 Farley ...................... 324/414
5,319,312 A * 6/1994 Segilia ...................... 324/556

* cited by examiner

Primary Examiner—Anjan K. Deb

(57) ABSTRACT

A circuit tester (1) for testing circuit integrity in a series-wired string of Christmas fairy lights powered by domestic mains electricity. The tester comprises or includes a housing; a probe including a pair of matching current sensors (1,2) protruding from the housing, the probe being adapted to be positioned between a respective pair of wires extending from a fairy light bulb socket, each sensor in the probe being electrically connected to a respective one of a matching pair of signal amplifiers (3,4) to provide a pair of amplified signals, one for each sensor; a logic gate (5) for receiving amplified signals output from the pair of signal amplifiers and comparing said signals for matching characteristics, the gate providing an output signal to a first display (6) on or in the housing indicative of received and matching signals and a, different, output signal to a second display (7) on or in the housing indicative of received mismatching signals from the amplifiers, the latter thereby indicating a discontinuity in that part of the circuit being tested between the pair of wires, such as by a broken fairy light bulb in that part of the circuit therebetween.

3 Claims, 4 Drawing Sheets

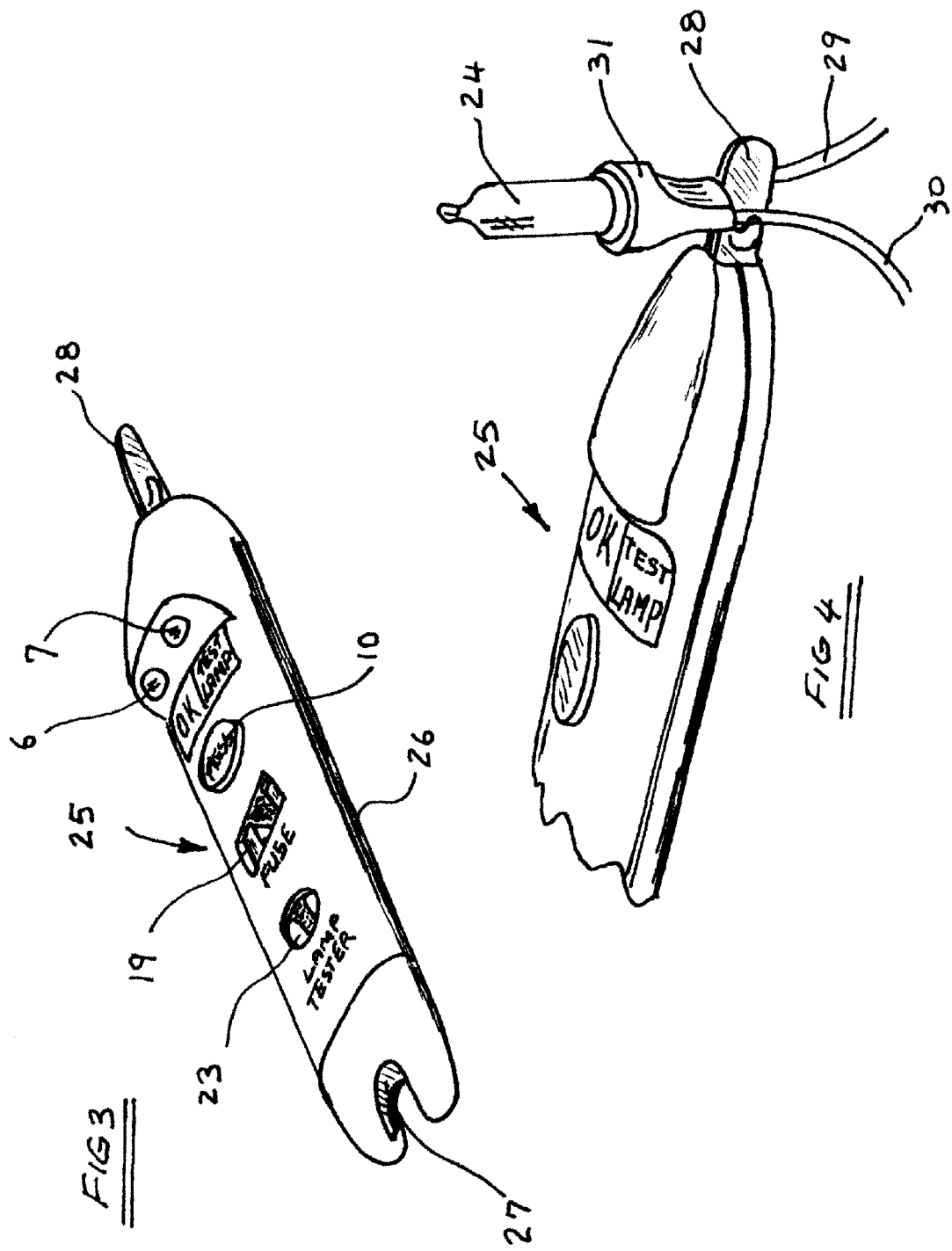

CIRCUIT TESTERS

This Application is a CONTINUATION IN PART of application Ser. No. 09/921,411 filed on Aug. 1, 2001, now abandoned.

This invention relates to circuit testers particularly, but not exclusively, to circuit testers for locating faulty or incorrectly fitted bulbs in a series-wired string of Christmas fairy lights.

BACKGROUND TO THE INVENTION

Most strings of fairy lights presently in use are series-wired and are powered by domestic mains electricity from a wall socket. The strings usually consist of sets of 50 2.2 v (nominal) fairy light bulbs wired in series and connected by various arrangements to a domestic electricity supply.

Almost all fairy light bulbs in manufacture now have an internal metal oxide coated "shunt" wire which is wrapped around the support terminals of the bulb filament. When the filament fails and the string becomes an open circuit, the full household voltage, typically 110 v in the USA, appears across the failed filament. This high voltage breaks down the insulating properties of the oxide coating and the "shunt" instantaneously conducts the full load current, and in doing so welds itself to the support terminals. This effectively bridges the open circuit left by the faulty bulb filament and enables the rest of the lights in the string to continue to work.

However, sometimes, these shunt wires fail and the open circuit remains open and at other times the wire conductors coming from the bulb break, in each case providing an open circuit and a dead light string. Similarly, these conductors may not make proper connections with the brass contacts inside the bulb socket, or the bulb itself may shake loose inside the socket, losing contact therewith.

The net effect of these various occurrences is to cause a very visible 50 bulb outage of the whole light string. Finding where the fault lies can be very time consuming and frustrating as it generally requires a substitution test with a known good bulb. Each bulb in the dead string needs to be swapped with the good bulb until the bad bulb is found, and should there be two or more bad bulbs in the same group of 50, substitution testing can be fruitless.

The Christmas fairy lights string industry has come up with several kinds of circuit testers for locating faulty light bulbs. These mostly rely upon an electrical sensing plate which senses the presence of an AC current field around the bulb. In general, a sensing plate is coupled to a high-gain amplifier which in turn activates an LED indicator in the presence of the AC field. Careful selection of components enable these devices to be adjusted so that the user can tell when there is a current in the region of the bulb, by the illumination of a single LED indicator.

However, the instructions for these kinds of devices describe a very complex means of conducting the required test in that it is first of all necessary to establish the active phase wire in the string and ensure that it appears on the bulb nearest the wall plug. Then it is necessary to methodically test each bulb up the string until the LED indicates a marked difference in response to the previously tested bulb. Even then, it is necessary to change that particular bulb and the bulbs on either side because such testers sense any field and hence they will sense the field in each bulb that works including the bad one because it still has an active wire going into it.

Such testers therefore do not discriminate between the two wires and cannot tell if the electric field is present on the outgoing wire as well as the incoming one.

This procedure is also much more complicated in practice as manufacturers loop the 50 bulb light strings back on themselves when they twist them into a single string, meaning that electrically consecutively wired bulbs are not necessarily next to each other in the string. The bulb nearest the wall plug may have the last bulb in that group of 50 next to it, therefore adding to the complexity of testing by using such devices. In addition, where groups of such strings are powered from the same socket extra wires have to be run through the initial string to activate the next string and any external "add-on" sockets for operating e.g. rotatable Christmas ornaments. As a result, the electrical energy being radiated by these additionally active wires can result in very ambiguous and frustrating readings being picked up by such testers which rely, as aforesaid, on simply detecting the presence of an AC field.

The foregoing disadvantages are partly solved by the teaching of U.S. Pat. No. 5,047,721 issued to Farley, the disclosure of which is incorporated herein by reference, which describes an apparatus and method utilising a differential sensing system where the light bulb of a fairy light string is placed into a cavity between a pair of electrodes (60), (62) embedded in the end of a probe (44). This arrangement provides a system for sensing differential AC fields at the bulb socket but requires the user to align the internal contacts of the bulb socket with the sensing plates or electrodes in order for an accurate reading to be taken. If the position is not perfectly aligned an ambiguous reading will be obtained as confirmed in the paragraph commencing at line 25 in column 5 of that patent. Necessarily, as the internal contacts of the light socket and bulb are not visible to the user, a careful explanation has to be given as to how to go about aligning these internal contacts and, in practice, it has been found that many potential users of such a device would not be prepared to devote time and attention to such a procedure.

Also, as a general comment, there are hundreds of different shaped bulbs on the market and hence using a universal sized cavity of light tester as shown in U.S. Pat. No. 5,047,721 will clearly not work in all cases.

A further disadvantage in pursuing the "light socket" approach to bulb testing or testing the integrity of the contacts between bulbs and bulb sockets etc is that, as is described in U.S. Pat. No. 6,257,740 issued to Gibboney, other types of bulb socket may include a spring loaded switch to ensure that if a bulb fails by not being seated properly in the light socket then the spring loaded switch ensures that the series circuit remains complete so that other bulbs in the string still remain illuminated. Although this disclosure shows that the spring loaded switch is perfectly symmetrical within the light socket, in practice this is almost never possible and hence different AC fields may be generated, again giving ambiguous readings.

A further disadvantage for all prior art testers stems from the fact that as the user often holds the bulb between fingers of a hand, the fingers themselves become an antenna that gives false indications to nearby capacitance sensors.

The present invention is derived from the realisation that it would be preferable to have the ability to test the integrity of a series-wired circuit, such as a fairy light string, which does not rely upon the need to have to test the circuit at the light bulb or light bulb socket but instead tests between the wires leading to such sockets, either directly adjacent the sockets or at positions along the light string remote therefrom.

SUMMARY OF THE INVENTION

According to the invention there is provided an electrically operable circuit tester for testing circuit integrity in a series-wired string of Christmas fairy lights powered by domestic mains electricity, the tester comprising or including a housing; a probe including a pair of matching current sensors protruding from the housing, the probe being adapted to be positioned between a respective pair of wires extending from a fairy light bulb socket, each sensor in the probe being electrically connected to a respective one of a matching pair of signal amplifiers to provide a pair of amplified signals, one for each sensor; a logic gate for receiving amplified signals output from the pair of signal amplifiers and comparing said signals for matching characteristics, the gate providing an output signal to a first display on or in the housing indicative of received and matching signals and a, different, output signal to a second display on or in the housing indicative of received mismatching signals from the amplifiers, the latter thereby indicating a discontinuity in that part of the circuit being tested between the pair of wires, such as by a broken fairy light bulb in that part of the circuit therebetween.

This arrangement provides a significant advantage over prior art devices such as that disclosed by Farley in that the sensors, which may typically be in the form of sensing plates, each act as a shield between the wire adjacent thereto and the other sensor, thereby reducing the possibility of stray signals being picked up from that wire by the other sensor. In contrast, where such sensors as disclosed in the prior art are disposed e.g. on opposing sides of the lamp socket, then each sensor is still able to sense the two electrical fields from both wires, thereby masking out the difference between the two signals and hence providing a lesser differential signal.

Preferably, the circuit tester is battery powered and includes a green LED as the first display and a red LED as the second display. Most preferably the current sensors are disposed symmetrically with respect to each other and are selectively adapted to be disposed between the pair of wires adjacent to the fairy light bulb socket on a Christmas light string.

The logic gate may conveniently comprise an Exclusive Or (XOR) gate or it may be part of a programmed microprocessor. A buzzer may be used to indicate the receipt of mismatched signals which may be in addition to the second display if the latter is a visual display, or the buzzer itself may take the form of the second display, being an audio display as opposed to a visual display.

The invention also extends to a method of testing a series wired circuit including the steps of placing two matching ac current field sensors symmetrically between a pair of wires forming part of the circuit to be tested, amplifying first and second current signals from both sensors and feeding them to a logic gate to compare both signals and provide a third signal in response thereto, said third signal being HI if, but only if, only one of the first and second signals is low and the other is high; and subsequently inverting said HI signal to a low signal to thereafter provide a potential across an electrically powered alarm device, such as a visual display or audio alarm, thereby to indicate a discontinuity in the circuits between the sensors, such as due to a faulty light bulb.

BRIEF DESCRIPTION OF THE DRAWINGS

The invention will now be described, by way of example only, with reference to the accompanying drawings, in which:

FIG. 3 is a perspective view of a circuit tester according to a first embodiment of the invention;

FIG. 4 is a perspective partial view of the circuit tester of FIG. 3 being used to test part of a fairy light string.

DETAILED DESCRIPTION OF THE DRAWINGS

Figure 1:
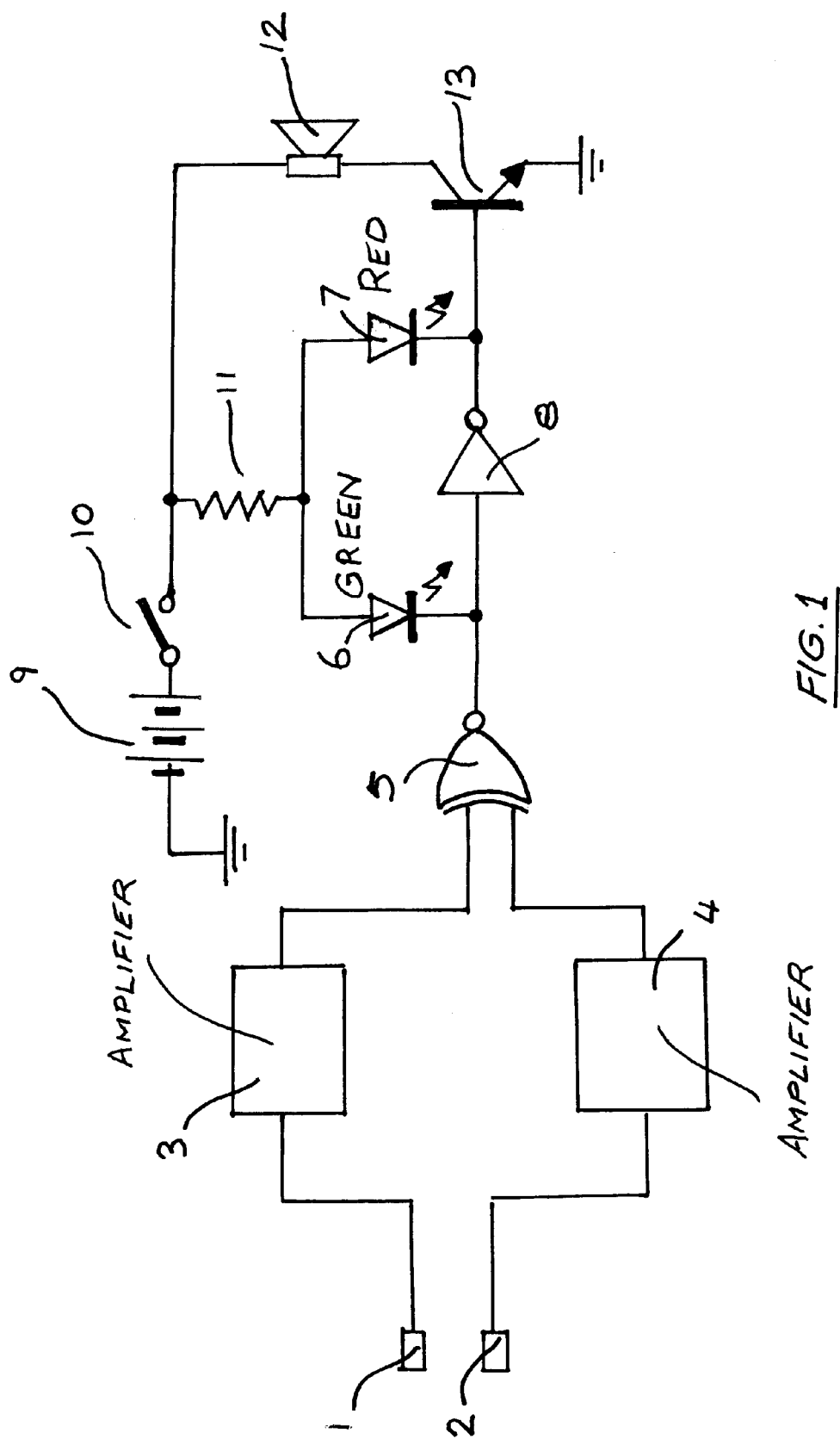
FIG. 1 is a schematic view of a logic circuit for performing the basic functions of the invention.

Referring firstly to FIG. 1, there is shown a simplified logic circuit which comprises a pair of flat metallic AC current sensors 1,2 of matching size and shape which are each electrically connected to respective and matching sensed current signal amplifiers 3,4 which provide a pair of amplified signals, one for each sensor 1,2. Following filtering and rectifying, these amplified signals are brought to an appropriate signal amplitude capable of operating logic gates, in this case an Exclusive OR (XOR) gate 5. As is well known, this kind of gate includes a circuit with two or more inputs and one output, which is high if, but only if, only one of the inputs is also high, although it will be readily understood by a person skilled in the art that a logic gate having such a characteristic may be constructed from other components such as NAND gates or may even be substituted by the use of a microprocessor programmed to duplicate this logic.

The other side of the XOR gate 5 is electrically connected to a first display 6 comprising a green LED, and a second display 7 comprising a red LED, the latter via an inverter, or NOT gate, 8. Electrical power for the circuit is provided from a battery 9 via a switch 10 with a resistor 11 being used to limit the current to the LED's 6,7 respectively.

Although not essential to the invention a buzzer 12 is also included in the circuit which is provided with an electrical signal from the red LED 7 via a transistor 13 to thereby sound a warning when the red LED 7 lights up.

In operation, the sensors 1,2 must each be positioned near to e.g. the wires coming out of a light bulb holder or socket of a fairy light in a manner that produces equal exposure to the AC fields being generated, in normal use, around the wires such that when the string is working correctly each sensor 1,2 will receive equal exposure to such fields.

It will therefore be apparent that if there is a fault in the series wired circuit between these two sensors 1,2, such as by a broken filament in a bulb, the AC fields around the wires sensed by each of the sensors 1,2 will be different, as will also be corresponding signals emanating from the amplifiers 3,4 to the XOR gate 5. Since the XOR gate 5 is configured to only provide a high output when there is one low input from one of the signal amplifiers 3,4 and one high input from the other, the current to the green LED 6 is also high, meaning that no potential exists on either side of the LED 6 so that it is not illuminated. In this condition, the inverter 8 also receives the high output from the gate 5 and converts it to a low input to the red LED 7, causing a potential to exist between either side of the red LED 7, which is therefore illuminated to indicate the disparity between the signals originating from the sensors 1,2 and hence the presence of a fault therebetween in the series wired circuit.

As will be understood, where no such fault exists the signals output from the amplifiers 3,4, will both be high, or low if no AC field is present, and hence the output signal from the XOR gate 5 will be low, meaning that the current to the green LED 6 is also low, therefore establishing a potential across it sufficient to enable it to be illuminated to show that no fault has been detected between the sensors 1,2 in the circuit. Similarly, the low input to the inverter 8 means that there will be a high output to the red LED 7, effectively cancelling out the potential that otherwise would exist thereacross such that the red LED is not illuminated.

Figure 2:
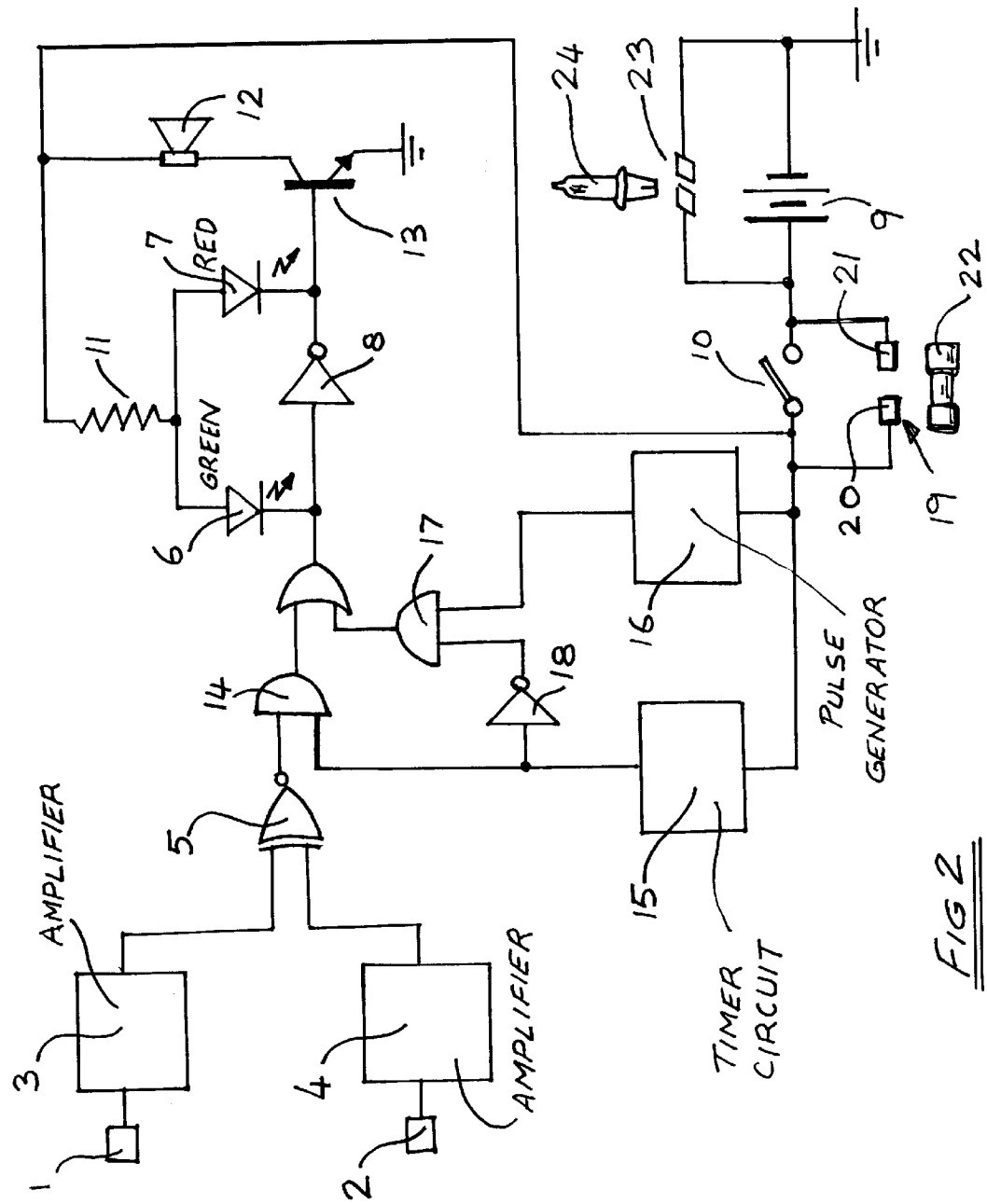
FIG. 2 is a schematic view of a preferred logic circuit for performing the basic functions of the invention with additional features.

A more refined circuit is shown with reference to FIG. 2 where like parts are numbered the same and which introduces extra functions including some already found in conventional circuit testers. In this circuit between the XOR gate 5 and the green LED 6/inverter 8, there is interposed a sub-circuit which includes an AND gate 14 which, by the use of a simple timer circuit 15 which applies a Hi signal to the AND gate 14 about one second after switch 10 has been pressed, in order to hold the input test signals from amplifiers 3,4 off for this period whilst the user of the circuit tester within which the various components are to be installed, to be described later, tests the unit. A simple pulse generator 16 is used to produce about a 5 Hz pulse train to another AND gate 17 along with an inverted signal from the timer circuit 15 via inverter 18. This turns the AND gate 17 on and off repeatedly during the one second start-up test period. The signal itself is pulsed at about three pulses per second so the green LED 6 and red LED 7 are turned on and off several times during the startup test phase. Similarly, the buzzer 12 is activated each time the red LED 7 is turned on. This 2 or 3 pulse flashing and buzzing lets the user know that the LED's 6,7 are working and the device is ready each time switch 10, which may be in the form of a test button, is pressed to close the circuit.

In practice, the switch 10 is usually pressed once the sensors 1,2 are in their test position, as described later, but can be held on as the circuit tester is moved around to test the integrity of the circuit.

As a further refinement, a fuse tester shown generally at 19 has two contact plates 20,21 for testing a fuse 22. Fuse integrity is indicated by the LED's 6 and 7 flashing and the buzzer 16 buzzing, as would occur in a normal test sequence.

In a still further refinement, individual bulbs can be lit using the bulb tester facility 23 which is directly connected to both terminals of the battery 9, which therefore provides a potential in the event that a bulb 24 is fully functional.

Turning now to FIGS. 3 and 4, a circuit tester in accordance with a first embodiment of the invention is shown generally at 25 and comprises a plastics housing 26 which incorporates therewithin the circuit shown and described with reference to FIG. 2 above such that it includes a green LED 6, a red LED 7, a press switch 10, a fuse tester 19 and associated fuse 22, as well as a test lamp socket 23 into which a fairy light bulb (not shown) may be inserted for testing the integrity thereof. The circuit tester 25 is intended to be hand-held and includes at a rear portion thereof a curved blade 27 set within a correspondingly shaped recess in the housing 26, the curved blade facilitating the removal of fairy light bulbs from their sockets. Protruding from the forward end of the housing 26 is a probe 28 within which are symmetrically disposed the sensors 1,2 (not shown).

As can be seen with reference to FIG. 4, the shape of the probe 28 allows it to be inserted between a pair of wires 29,30 forming part of the series-wired circuit of a light string, only part of which is shown, and which comprises a light bulb socket 31 into which has been inserted a fairy light bulb 24.

In the position shown, the probe 28 and hence the sensors 1,2 are positioned symmetrically between the wires 29,30, this being an important condition enabling them to sense any significant differences in the AC field caused by current flowing through the wires 29,30 so that if, for example, wire 29 was nearmost to the attendant plug and mains socket (not shown) as compared to wire 30, it will be apparent that failure of the bulb 24 would mean that the AC field in the wire 30 would effectively be non-existent, or at least sufficiently different to the AC field in wire 29 to be detectable by means of the XOR gate 5.

As explained previously, by placing the sensors 1,2 symmetrically in the probe 28 they each shield the other from unwanted signals from the wires 29,30, thereby leading to a reduced common-mode signal, better differential input signals and hence more reliable test results.

Figure 5:
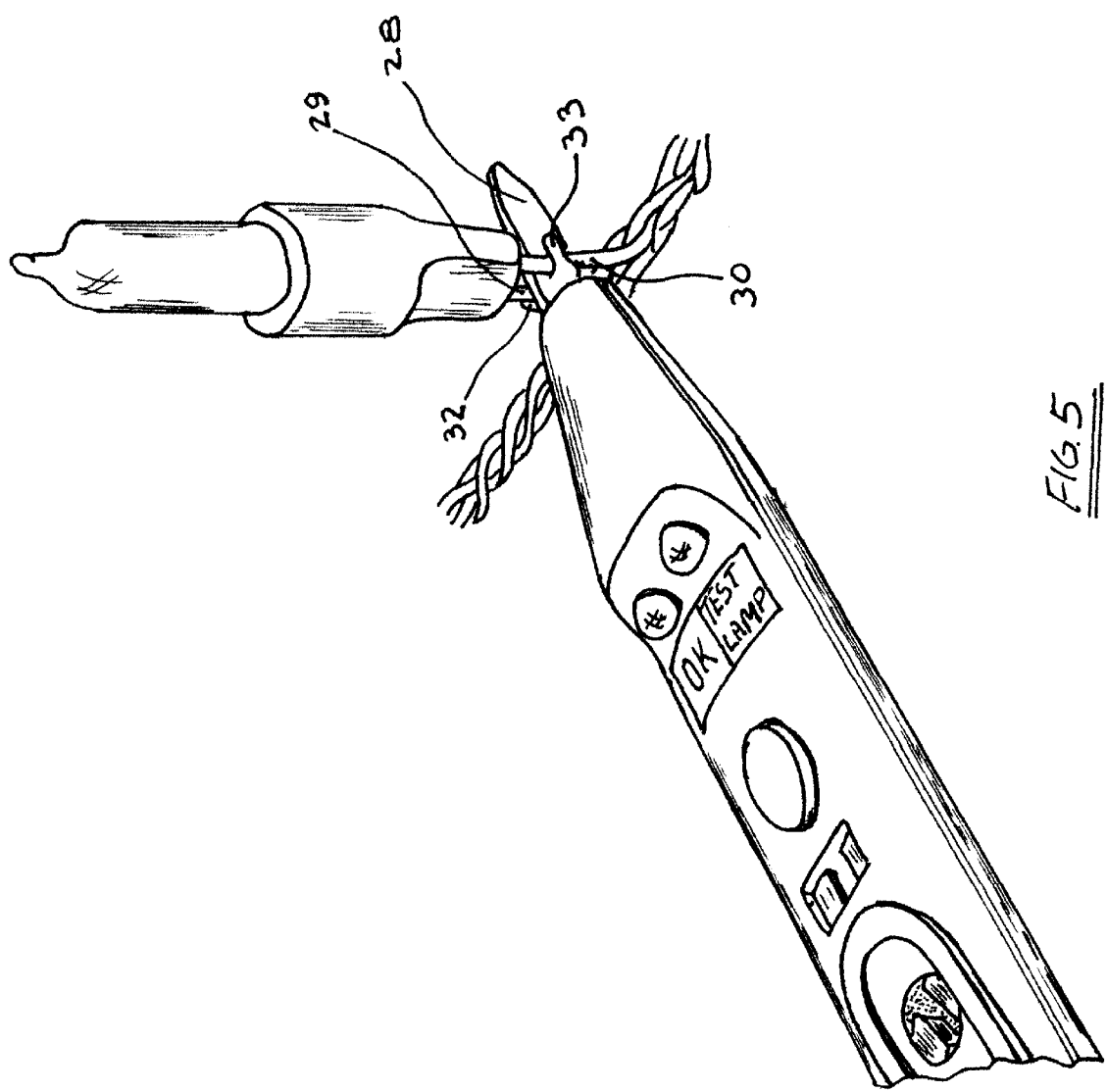
FIG. 5 is a perspective view of a second embodiment of circuit tester shown testing part of a fairy light string.

In FIG. 5 there is shown a second embodiment of circuit tester according to the invention which is generally similar to the first embodiment shown with reference to FIGS. 3 and 4, but which differs by the addition of a pair of partly arcuate wire guides 32 and 33 on either side of the probe 28, only part of which wire guide 32 is visible by being partially obscured by the wire 29. It will be seen that the wires 29,30 are therefore "captured" by the wire guides 32,33 to thereby ensure that their respective distances from the sensors 1,2 within the probe 28 are as closely matched as possible so that the accuracy of the measurement subsequently taken by the circuit tester is maximised in this region.

The invention in its various embodiments therefore provides a relatively simple but accurate way of testing for discontinuities within a series wired circuit such as a fairy light string, although it will be apparent to those skilled in the art that the principles of the invention may be applied to different circumstances and circuit testers incorporating such principles made therefor, without departing from the spirit or scope of the invention.

What I claim is:

1. An electrically operable circuit tester for testing circuit integrity in a series-wired string of Christmas fairy lights powered by domestic mains electricity, the tester comprising or including a housing; a probe including a pair of matching current sensors protruding from the housing, the probe being adapted to be positioned between a respective pair of wires extending from a fairy light bulb socket, each sensor in the probe being electrically connected to a respective one of a matching pair of signal amplifiers to provide a pair of amplified signals, one for each sensor; a logic gate for receiving amplified signals output from the pair of signal amplifiers and comparing said signals for matching characteristics, the gate providing an output signal to a first display on or in the housing indicative of received and matching signals and a, different, output signal to a second display on or in the housing indicative of received mismatching signals from the amplifiers, the latter thereby indicating a discontinuity in that part of the circuit being tested between the pair of wires, such as by a broken fairy light bulb in that part of the circuit therebetween.

2. A circuit tester according to claim 1 wherein the sensors are disposed symmetrically with respect to each other.

3. A circuit tester according to claim 1 including a pair of symmetrically disposed guides for guiding the wires symmetrically about the sensors prior to testing circuit integrity in the fairy light string.

* * * * *